United States Patent
Kudo et al.

(10) Patent No.: US 6,723,488 B2
(45) Date of Patent: Apr. 20, 2004

(54) PHOTORESIST COMPOSITION FOR DEEP UV RADIATION CONTAINING AN ADDITIVE

(75) Inventors: Takanori Kudo, Bedminster, NJ (US); Ralph R. Dammel, Flemington, NJ (US); Munirathna Padmanaban, Bridgewater, NJ (US)

(73) Assignee: Clariant Finance (BVI) Ltd, Tortola (VG)

( * ) Notice: Subject to any disclaimer, the term of this patent is extended or adjusted under 35 U.S.C. 154(b) by 168 days.

(21) Appl. No.: 10/037,161

(22) Filed: Nov. 7, 2001

(65) Prior Publication Data

US 2003/0087180 A1 May 8, 2003

(51) Int. Cl.$^7$ ................................. G03F 7/004
(52) U.S. Cl. ..................... 430/270.1; 430/296; 430/905
(58) Field of Search .............................. 430/270.1, 296, 430/905

(56) References Cited

U.S. PATENT DOCUMENTS

| | | | |
|---|---|---|---|
| 4,491,628 A | | 1/1985 | Ito et al. |
| 5,252,427 A | * | 10/1993 | Bauer et al. ............... 430/270 |
| 5,350,660 A | | 9/1994 | Urano et al. |
| 5,843,624 A | | 12/1998 | Houlihan et al. |
| 5,879,857 A | | 3/1999 | Chandross et al. |
| 6,013,416 A | | 1/2000 | Nozaki et al. |
| 6,136,499 A | * | 10/2000 | Goodall et al. .......... 430/270.1 |
| 6,461,789 B1 | | 10/2002 | Hatakeyama et al. |
| 6,492,086 B1 | * | 12/2002 | Barclay et al. .......... 430/270.1 |
| 2001/0049071 A1 | * | 12/2001 | Merritt et al. |
| 2002/0048723 A1 | | 4/2002 | Lee et al. |
| 2003/0008230 A1 | * | 1/2003 | Li et al. |

FOREIGN PATENT DOCUMENTS

| | | |
|---|---|---|
| EP | 0 726 500 A | 8/1996 |
| EP | 0 789 278 A2 | 8/1997 |
| EP | 0 936 504 A | 8/1999 |
| GB | 2320718 A | 7/1998 |
| GB | 2332679 A | 6/1999 |
| WO | WO 00/97/33198 | 9/1997 |
| WO | WO 00/17712 | 3/2000 |
| WO | WO 00/67072 | 11/2000 |

OTHER PUBLICATIONS

Takanori Kudo et al, XP–002231799, "CD Changes of 193 nm Resists During SEM Measurement", SPIE, 2001, vol. 4345 pp. 179–189,.

U.S. patent application Ser. No. 09/854,312, Dammel et al, filed May 11, 2001.

M. Dalil Rahman et al, "Cycloolefin/Maleic Anhydride Copolymers for 193 nm Resist Compositions", SPIE Conference on Advances in Resist Technology and Processing XVI, SPIE vol. 3678, pp. 1193–1200.

R. R. Dammel et al, "Lithographic Performance of a Dry–Etch Stable Methacrylate Resist at 193 nm", SPIE, vol. 3333, pp. 144–151.

* cited by examiner

Primary Examiner—Rosemary Ashton
(74) Attorney, Agent, or Firm—Sangya Jain

(57) ABSTRACT

The present invention relates to a photoresist composition sensitive to radiation in the deep ultraviolet, particularly a positive working photoresist sensitive in the range of 100–200 nanometers(nm). The photoresist composition comprises a) a polymer that is insoluble in an aqueous alkaline solution and comprises at least one acid labile group, and furthermore where the polymer is essentially non-phenolic, b) a compound capable of producing an acid upon radiation, and c) an additive that reduces the effect of electrons and ions on the photoresist image.

13 Claims, No Drawings

PHOTORESIST COMPOSITION FOR DEEP UV RADIATION CONTAINING AN ADDITIVE

FIELD OF INVENTION

The present invention relates to a novel photoresist composition that does not undergo photoresist image deterioration in the presence of electrons or ions, particularly when viewed in a scanning electron microscope or exposed to electron beams during curing.

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a deprotection reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Photoresists sensitive to short wavelengths, between about 100 nm and about 300 nm can also be used where subhalfmicron geometries are required. Particularly preferred for exposure below 200 nm are photoresists comprising non-aromatic polymers, a photoacid generator, optionally a solubility inhibitor, and solvent.

High resolution, chemically amplified, deep ultraviolet (100–300 nm) positive and negative tone photoresists are available for patterning images with less than quarter micron geometries. To date, there are three major deep ultraviolet (uv) exposure technologies that have provided significant advancement in miniaturization, and these use lasers that emit radiation at 248 nm, 193 nm and 157 nm. Examples of such photoresists are given in the following patents and incorporated herein by reference, U.S. Pat. Nos. 4,491,628, 5,350,660, 5,843,624, GB 2320718, WO 00/17712 and WO 00/67072. Photoresists for 248 nm exposure have typically used substituted polyhydroxystyrene and its copolymers. On the other hand, photoresists for exposure at wavelengths below 200 nm require non-aromatic polymers, since aromatics are opaque at this wavelength. Generally, alicyclic hydrocarbons are incorporated into the polymer to replace the etch resistance of the aromatic functionality. Photoresists that have been designed for use below 200 nm have so far used polymers with the alicyclic compounds (olefins) incorporated in the polymer backbone or acrylate polymers with pendant alicyclic functionalities. Photoresists sensitive at 157 nm may use fluorinated polymers, which are substantially transparent at that wavelength.

It has been found that certain types of photoresists, especially those developed for imaging below 200 nm and lacking aromatic functionality, when viewed in a scanning electron microscope during inspection of the dimension of the imaged photoresist, or exposed to electron or ion beams during curing, undergo undesirable changes in the dimensions of the photoresist image. One aspect of this particular image distortion, generally referred to as linewidth slimming (LWS), is observed as slimming of lines or expansion of holes and trenches. Oftentimes the measurement of the imaged photoresist features takes significant amount of time; during this time the image dimensions can change and result in erroneous measurements. This effect of electrons and ions on changes of the photoresist linewidth has become a critical issue as the printed dimensions have become smaller. Photoresists based on acrylate polymers have been found to be more susceptible to linewidth slimming compared to photoresists derived from cycloolefin based photoresists,.

While the cause of LWS is not clearly understood, and wishing not to be bound by the theory, those skilled in the art believe that several mechanisms are possible when photoresists, especially those designed for imaging below 200 nm, are treated with electrons or ions. Some of the possible mechanisms are crosslinking of the polymer, thermal annealing, decomposition, evaporation of components in the photoresist film, chain scission of the polymer, sputtering, etc. In the past equipment modifications or process changes have helped to improve LWS. The present application has addressed the problem by the incorporation of additives into the photoresist, hence avoiding additional equipment and processing costs. It has been found that additives that inhibit some of the mechanisms discussed previously improve the degradation of the image profile. Monomeric additives that have aromatic functionality, free radical quenchers, and crosslinking agents have found to be especially effective. The object of the present invention is to reduce the effect of electrons and ions on photoresists useful for imaging below 200 nm by the incorporation of monomeric additives into the photoresist.

SUMMARY

The present invention relates to a photoresist composition sensitive to radiation in the deep ultraviolet, where the photoresist composition comprises a) a polymer that is insoluble in an aqueous alkaline solution and comprises at least one acid labile group, and furthermore where the polymer is essentially non-phenolic, b) a compound capable of producing an acid upon radiation, and c) an additive that is selected from a group consisting of anthracene, substituted anthracene, quinone, substituted quinone, crosslinking agents, and iodo substituted aromatic compounds and their derivatives. The photoresist is irradiated preferably with wavelength of light at 193 nm or 157 nm. The invention also relates to a process of forming an image which is resistant to image deterioration in the presence of electrons and ions, comprising the steps of forming a coating of photoresist film of the novel composition, imagewise exposing the photoresist film, developing the photoresist film and placing the imaged photoresist film in an environment of electrons and/or ions. The environment of electrons and/or ions may be a scanning electron microscope or a curing process.

DESCRIPTION

The present invention relates to a photoresist composition sensitive to radiation in the deep ultraviolet, particularly a positive working photoresist sensitive in the range of 100–200 nanometers(nm). The photoresist composition comprises a) a polymer that is insoluble in an aqueous alkaline solution and comprises at least one acid labile group, and furthermore where the polymer is essentially non-phenolic, b) a compound capable of producing an acid upon radiation, and c) an additive that reduces the effect of electrons and ions on the photoresist image. The photoresist is irradiated preferably with wavelength of light at 193 nm or 157 nm. The additive is selected from a group consisting of polycyclic aromatic compounds such as anthracenes and anthraldehydes, radical quenchers such as quinones and substituted quinones, crosslinking agents, iodine containing compounds such as iodo-substituted aromatics and their derivatives. The invention also relates to a process of imaging the novel photoresist.

The polymer of the invention is one that has groups that make the polymer insoluble in aqueous alkaline solution, but such a polymer in the presence of an acid catalytically deprotects the polymer, wherein the polymer then becomes soluble in an aqueous alkaline solution. The polymers are transparent below 200 nm, and are essentially non-phenolic, and preferably acrylates and/or cycloolefin polymers. Such polymers are, for example, but not limited to, those described in U.S. Pat. Nos. 5,843,624, 5,879,857, WO 97/33,198, EP 789,278 and GB 2,332,679. Nonaromatic polymers that are preferred for irradiation below 200 nm are substituted acrylates, cycloolefins, substituted polyethylenes, etc.

Polymers based on acrylates are generally based on poly(meth)acrylates with pendant alicyclic groups. Examples of pendant alicyclic groups, may be adamantyl, tricyclodecyl, isobornyl and menthyl. Such polymers are described in R. R. Dammel et al., Advances in Resist Technology and Processing, SPIE, Vol. 3333, p144, (1998). Examples of these polymers include poly(2-methyl-2-adamantane methacrylate-co-mevalonic lactone methacrylate), poly(carboxy-tetracyclododecyl methacrylate-co-tetrahydropyranylcarboxytetracyclododecyl methacrylate), poly(tricyclodecylacrylate-co-tetrahydropyranylmethacrylate-co-methacrylicacid), poly(3-oxocyclohexyl methacrylate-co-adamantylmethacrylate).

Polymers synthesized from cycloolefins, with norbornene and tetracyclododecene derivatives, may be polymerized by ring-opening metathesis, free-radical polymerization or using metal organic catalysts. Cycloolefin derivatives may also be copolymerized with maleic anhydride or with maleimide or its derivatives. Such polymers are described in the following reference and incorporated herein, M-D. Rahman et al, Advances in Resist Technology and Processing, SPIE, Vol. 3678, p1193, (1999). Examples of these polymers include poly((t-butyl 5-norbornene-2-carboxylate-co-2-hydroxyethyl 5-norbornene-2-carboxylate-co-5-norbornene-2-carboxylic acid-co-maleic anhydride), poly(t-butyl 5-norbornene-2-carboxylate-co-isobornyl-5-norbornene-2-carboxylate-co-2-hydroxyethyl 5-norbornene-2-carboxylate-co-5-norbornene-2-carboxylic acid-co-maleic anhydride), poly(tetracyclododecene-5-carboxylate-co-maleic anhydride) and the like.

Fluorinated non-phenolic polymers, useful for 157 nm exposure, also exhibit LWS and benefit from the incorporation of additives described in the present invention. Such polymers are described in WO 00/17712 and WO 00/67072 and incorporated herein by reference. Example of one such polymer is poly(tetrafluoroethylene-co-norbornene-co-5-hexafluoroisopropanol-substituted 2-norbornene.

Polymers synthesized from cycloolefins and cyano containing ethylenic monomers are described in the U.S. patent application Ser. No. 09/854,312 and incorporated herein by reference.

The molecular weight of the polymers is optimized based on the type of chemistry used and on the lithographic performance desired. Typically, the weight average molecular weight is in the range of 3,000 to 30,000 and the polydispersity is in the range 1.1 to 5, preferably 1.5 to 2.5.

Suitable examples of the acid generating photosensitive compounds include onium-salts, such as, diazonium salts, iodonium salts, sulfonium salts, halides and esters, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutanesufonate, trilphenylsulfonium trifluromethanesuflonate, triphenylsulfonium nonafluorobutanesufonate and the like. Other compounds that form an acid upon irradiation may be used, such as triazines, oxazoles, oxadiazoles, thiazoles, substituted 2-pyrones. Phenolic sulfonic esters, bis-sulfonylmethanes, bis-sulfonylmethanes or bis-sulfonyldiazomethanes, are also preferred.

The specific additive incorporated into the photoresist of the present invention is one that prevents the degradation of the photoresist image when it is exposed to an environment of electrons or ions. It has been unexpectedly found that certain additives reduce the degradation of the photoresist image when it is observed in a scanning electron microscope or cured with electron beams. Such additives are polycyclic aromatics, quinone or its derivatives, crosslinking agents, or iodo-substituted aromatic compounds. Without being limited, examples of derivatives of polycyclic aromatics can be anthracene, anthracenemethanol and anthraldehyde, specifically 9-anthracenemethanol and 9-anthraldehyde; examples of quinone are hydroquinone and t-butyl hydroquinone: examples of crosslinking agents are N,O acetals, such as glycoluril, specifically tetramethoxymethyl glycouril; and, examples of iodo-substituted aromatic compounds are iodobenzene, specifically 1,4-diiodotetrafluorobenzene.

The amount of the additive is from 0.1 weight % to 5 weight % with respect to the total photoresist solids. More preferably, 0.3 weight % to 2 weight % is used.

The solid components of the present invention are dissolved in an organic solvent. The amount of solids in the solvent or mixture of solvents ranges from about 5 weight % to about 50 weight %. The polymer may be in the range of 5 weight % to 90 weight % of the solids and the photoacid generator may be in the range of 2 weight % to about 50 weight % of the solids. Suitable solvents for such photoresists may include propylene glycol mono-alkyl ether, propylene glycol alkyl (e.g. methyl)ether acetate, ethyl-3-ethoxypropionate, xylene, diglyme, amyl acetate, ethyl lactate, butyl acetate, 2-heptanone, ethylene glycol monoethyl ether acetate, and mixtures thereof.

Various other additives such as colorants, non-actinic dyes, anti-striation agents, plasticizers, adhesion promoters, coating aids, speed enhancers and surfactants may be added to the photoresist composition before the solution is coated onto a substrate. A sensitizer that transfers energy from a particular range of wavelengths to a different exposure wavelength may also be added to the photoresist composition. Often bases are also added to the photoresist to prevent t-tops at the surface of the image. Examples of bases are amines, ammonium hydroxide, and photosensitive bases. Particularly preferred bases are trioctylamine, diethanolamine and tetrabutylammonium hydroxide.

The prepared photoresist composition solution can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist may also be coated over anti-reflective coatings.

The photoresist coatings produced by the described procedure are particularly suitable for application to silicon/silicon dioxide wafers, such as are utilized in the production of microprocessors and other miniaturized integrated circuit components. An aluminum/aluminum oxide wafer can also be used. The substrate may also comprise various polymeric resins, especially transparent polymers such as polyesters.

The photoresist composition solution is then coated onto the substrate, and the substrate is treated at a temperature from about 70° C. to about 150° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the solid components. In general, one desires to minimize the concentration of solvents and this first temperature. Treatment is conducted until substantially all of the solvents have evaporated and a thin coating of photoresist composition, on the order of half a micron (micrometer) in thickness, remains on the substrate. In a preferred embodiment the temperature is from about 95° C. to about 120° C. The treatment is conducted until the rate of change of solvent removal becomes relatively insignificant. The temperature and time selection depends on the photoresist properties desired by the user, as well as the equipment used and commercially desired coating times. The coating substrate can then be imagewise exposed to actinic radiation, e.g., ultraviolet radiation, at a wavelength of from about 100 nm (nanometers) to about 300 nm, x-ray, electron beam, ion beam or laser radiation, in any desired pattern, produced by use of suitable masks, negatives, stencils, templates, etc.

The photoresist is then subjected to a post exposure second baking or heat treatment before development. The heating temperatures may range from about 90° C. to about 150° C., more preferably from about 100° C. to about 130° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in a developing solution or developed by spray development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides. One preferred developer is an aqueous solution of tetramethyl ammonium hydroxide. After removal of the coated wafers from the developing solution, one may conduct an optional post-development heat treatment or bake to increase the coating's adhesion and chemical resistance to etching conditions and other substances. The post-development heat treatment can comprise the oven baking of the coating and substrate below the coating's softening point or UV hardening process. In industrial applications, particularly in the manufacture of microcircuitry units on silicon/silicon dioxide-type substrates, the developed substrates may be treated with a buffered, hydrofluoric acid base etching solution or dry etching. Prior to dry etching the photoresist may be treated to electron beam curing in order to increase the dry-etch resistance of the photoresist. Apparatus that provide electron beam curing are available commercially, such as Electroncure™ 4000, available from Electron Vision Corp., San Diego, Calif. 92131. When a standard photoresist is electron beam cured there is loss of critical dimensions; for example, for a contact hole imaged in a standard photoresist film the corners are rounded, which leads to poor image transfer during dry etching. However, when the novel photoresist of the present invention is used, the loss of critical dimensions is minimized and the contact hole is no longer rounded. The exact process conditions to give the most effective electron beam curing to increase dry etch resistance and/or reduce LWS are optimized according to the apparatus and the photoresist used.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

EXAMPLES

Comparative Example 1

163.9 g of poly(2-methyladamantyl methacrylate-co-2-mevalonic lactone methacrylate), 2.76 g of triphenylsulfonium nonafluorobutanesulfonate, 7.75 g of 1 wt % ethyl lactate solution of diethanolamine and 1.74 g of 10 wt % ethyl lactate solution of a surfactant (fluoroaliphatic polymeric ester, supplied by 3M Corporation, St. Paul, Minn.) were dissolved in 1273 g of ethyl lactate to give a photoresist solution. The photoresist solution was filtered using 0.2 $\mu$m filter. Separately, a silicon substrate with an antireflective coating was prepared by spin coating the bottom antireflective coating solution, AZ® EXP ArF-1 B.A.R.C., (available from Clariant Corporation, Somerville, N.J. 08876) onto the silicon substrate and baking at 175° C. for 60 sec. The B.A.R.C film thickness was kept to 39 nm. The photoresist solution was then coated on the B.A.R.C coated silicon substrate. The spin speed was adjusted such that the photoresist film thickness was 390 nm. The resist film was baked at 115° C. for 60 sec. It was then exposed on a 193 nm ISI ministepper (numerical aperture of 0.6 and coherence of 0.7) using a chrome on quartz binary mask. After exposure, the wafer was post-exposure baked at 110° C. for 60 sec. Developing was carried out using 2.38 weight % aqueous solution of tetramethyl ammonium hydroxide for 60 seconds. The line and space patterns were then observed on a scanning electron microscope. The photoresist formulation had a sensitivity of 20 mJ/cm$^2$ and a linear resolution of 0.13 $\mu$m.

Comparative Example 2

19.85 g of polymer (made from 100 parts of maleic anhydride, 35 parts of t-butyl 5-norbornene-2-carboxylate, 10 parts of 2-hydroxyethyl 5-norbornene-2-carboxylate, 5 parts of 5-norbornene-2-carboxylic acid, 25 parts of 2-methyl adamantyl methacrylate, and 25 parts of 2-mevalonic lactone methacrylate), 0.33 g of triphenylsulfonium nonafluorobutanesulfonate, 6.32 g of 1 wt % propylene glycol monomethyl ether acetate (PGMEA) solution of trioctylamine and 0.18 g of 10 wt % propyleneglycol monomethyether acetate (PGMEA) solution of a surfactant (fluoroaliphatic polymeric ester, supplied by 3M corporation, Minnesota) were dissolved in 123 g of PGMEA. The solution was filtered using 0.2 $\mu$m filter and processed in a similar manner to that described in Comparative Example 1 except the resist film was baked at 110° C. for 90 sec, post-exposure baked at 130° C. for 90 sec and development was carried out for 30 sec. The formulation had a sensitivity of 17 mJ/cm$^2$ and a linear resolution of 0.09 $\mu$m.

Example 1

0.01725 g of 9-anthracene methanol was dissolved in 30g of the photoresist prepared in Comparative Example 1. The solution was filtered using 0.2 $\mu$m filter and processed in a similar manner to that described in Comparative Example 1. A linear resolution of 0.12 $\mu$m was obtained at a dose of 24 mJ/cm$^2$.

Example 2

0.01725 g of t-butyl hydroquinone was dissolved in 30 g of a photoresist prepared in Comparative Example 1. The solution was filtered using 0.2 $\mu$m filter and processed in a similar manner to that described in Comparative Example 1. A linear resolution of 0.14 $\mu$m was obtained at a dose of 28 mJ/cm$^2$.

Example 3

0.01725 g of tetramethoxymethyl glycoluril was dissolved in 30 g of a photoresist prepared in Comparative Example 1. The solution was filtered using 0.2 $\mu$m filter and processed in a similar manner to that described in Comparative Example 1. A linear resolution of 0.14 $\mu$m was obtained at a dose of 66 mJ/cm$^2$.

Example 4

0.0135 g of 9-anthraldehyde was dissolved in 20 g of a photoresist prepared in Comparative Example 2. The solution was filtered using 0.2 $\mu$m filter and processed in a similar manner to that described in Comparative Example 2. A linear resolution of 0.08 $\mu$m was obtained at a dose of 18.5 mJ/cm$^2$.

Example 5

0.0237 g of 1,4-diiodotetrafluorobenzene was dissolved in 20 g of a photoresist prepared in Comparative Example 2. The solution was filtered using 0.2 $\mu$m filter and processed in a similar manner to that described in Comparative Example 2. A linear resolution of 0.10 $\mu$m was obtained at a dose of 18 mJ/cm$^2$.

Example 6

5.89 g of polymer (made from 100 parts of maleic anhydride, 35 parts of t-butyl 5-norbornene-2-carboxylate, 10 parts of 2-hydroxyethyl 5-norbornene-2-carboxylate, 5 parts of 5-norbornene-2-carboxylic acid, 25 parts of 2-methyl adamantyl methacrylate, and 25 parts of 2-mevalonic lactone methacrylate), 0.154 g of diphenyl iodonium nonafluorobutanesulfonate, 2.80 g of 1 wt % PGMEA(propyleneglycolmonomethyletheracetate) solution of trioctylamine and 0.054 g of 10 wt % PGMEA solution of surfactant were dissolved in 38 g of PGMEA. The solution was filtered using 0.2 $\mu$m filter and processed in a similar manner to that described in Comparative Example 2. A linear resolution of 0.08 $\mu$m was obtained at a dose of 28 mJ/cm$^2$.

Example 7

0.0135 g of 9-anthracenemethanol was dissolved in 20 g of a photoresist prepared in Example 8. The solution was filtered using 0.2 $\mu$m filter and processed in a similar manner to that described in Comparative Example 2. A linear resolution of 0.08 $\mu$m was obtained at a dose of 27 mJ/cm$^2$.

Line Width Slimming (LWS) Measurements

Line width slimming of the photoresist critical dimensions during scanning electron microscope (CD SEM) measurements were carried out on a KLA 8100 CD SEM. The rate of line width change over a period of time was measured automatically using a 50% threshold at acceleration voltage of 600V. An average of two measurements was taken for 0.15 $\mu$m lines. The percentage of change in the critical dimension was measured immediately and then after 30 seconds. The results are summarized in Table 1 for all of the Examples described above.

TABLE 1

Change in critical dimensions (CD) after 30 seconds in the CD SEM

| Example No. | Reduction in CD (%) |
|---|---|
| Comp.Ex. 1 | 89.6 |
| Comp.Ex. 2 | 89.5 |
| Ex. 1 | 94.0 |
| Ex. 2 | 91.0 |
| Ex. 3 | 91.2 |
| Ex. 6 | 92.1 |
| Ex. 7 | 94.1 |
| Ex. 8 | 91.5 |
| Ex. 9 | 93.3 |

As shown in Table 1, photoresists without an additive, as in Comparative Examples 1 and 2, exhibit more than 10% reduction in the critical dimension after 30 seconds inspection time in the CD SEM. However, the novel photoresists of the present invention retain more than 91% of the critical dimension when treated under similar conditions. Minimal reduction in the critical dimension is preferred. It is preferred that this reduction in critical dimension be less than 10%.

What is claimed is:

1. A photosensitive composition useful for exposure below 200 nm and capable of reducing the impact of electrons and ions on photoresist deterioration, comprising;
    a) a polymer that is insoluble in an aqueous alkaline solution and comprises at least one acid labile group, and furthermore where the polymer is essentially nonaromatic;
    b) a compound capable of producing an acid upon radiation; and;
    c) an additive selected from a group consisting of quinones, substituted quinones, and iodosubstituted aromatic compounds.

2. The photosensitive composition according to claim 1, where the additive is selected from hydroquinone, t-butyl hydroquinone, and iodo substituted benzene.

3. The photosensitive composition according to claim 1, where the additive is 1.4-diiodotetrafluorobenzene.

4. The photoresist composition according to claim 1, where the polymer comprises alicyclic groups.

5. The photoresist composition according to claim 4, where the polymer has acrylate backbone with pendant alicyclic groups.

6. The photoresist composition according to claim 4, where the polymer has a backbone of alicyclic groups.

7. The photoresist composition according to claim 4, where the polymer is a copolymer of maleic anhydride and substituted and/or unsubstituted alicyclic monomers.

8. The photoresist composition according to claim 1, where the polymer contains no aromatic groups.

9. A process for forming a photoresist image comprising the steps of:
    a) forming a coating on a substrate of a photosensitive composition useful for exposure below 200 nm and capable of reducing the impact of electrons and ions on photoresist deterioration, comprising:
        i) a polymer that is insoluble in an aqueous alkaline solution and comprises at least one acid labile group, and furthermore where the polymer is essentially nonaromatic;
        ii) a compound capable of producting an acid upon radiation; and;
        iii) an additive selected from a group consisting of polycyclic aromatics, quinone, substituted quinones, crosslinking agents and iodo substituted aromatic compounds;
    b) imagewise exposing the coating of the photosensitive composition;
    c) developing the photosensitive composition with an aqueous alkaline developer; and, d) electron curing the photosensitive composition.

10. The process of claim 9, where the imagewise exposure is at wavelengths of 193 nm or 157 nm.

11. The process of claim 9, where the aqueous alkaline solution comprises tetramethyl ammonium hydroxide.

12. The process of claim 9, further comprising an electron curing step.

13. The process of claim 9, further comprising inspection of the photoresist image in a scanning electron microscope.

* * * * *